United States Patent [19]

Culp

[11] Patent Number: 5,237,236

[45] Date of Patent: Aug. 17, 1993

[54] WALKING TOOTHED ACTUATOR

[75] Inventor: Gordon W. Culp, Van Nuys, Calif.

[73] Assignee: Rockwell International Corporation, Seal Beach, Calif.

[21] Appl. No.: 976,706

[22] Filed: Nov. 16, 1992

Related U.S. Application Data

[63] Continuation of Ser. No. 836,495, Feb. 18, 1992, abandoned.

[51] Int. Cl.$^5$ .............................................. H01L 41/08
[52] U.S. Cl. ...................................... 310/317; 310/323; 310/328
[58] Field of Search ............... 310/316, 317, 323, 328; 307/18, 38

[56] References Cited

U.S. PATENT DOCUMENTS

| | | | |
|---|---|---|---|
| 4,622,483 | 11/1986 | Staufenberg, Jr. et al. | 310/317 |
| 4,628,275 | 12/1986 | Skipper et al. | 330/10 |
| 4,734,610 | 3/1988 | Okumura et al. | 310/323 |
| 4,752,865 | 6/1988 | Hatakeyama et al. | 307/38 |
| 4,857,757 | 8/1989 | Sato et al. | 310/317 |
| 4,928,030 | 5/1990 | Culp | 310/316 |
| 4,947,074 | 8/1990 | Suzuki | 310/316 |
| 5,043,621 | 8/1991 | Culp | 310/316 |
| 5,049,775 | 9/1991 | Smits | 310/328 |
| 5,057,734 | 10/1991 | Tsuzuki et al. | 310/317 |
| 5,068,566 | 11/1991 | Culp | 310/328 |
| 5,144,187 | 9/1992 | Culp | 310/328 |
| 5,178,012 | 1/1993 | Culp | 73/510 |

FOREIGN PATENT DOCUMENTS

| | | | |
|---|---|---|---|
| 0022477 | 2/1985 | Japan | 310/328 |
| 0137377 | 6/1986 | Japan | 310/323 |
| 0008880 | 1/1989 | Japan | 310/323 |
| 0148077 | 6/1989 | Japan | 310/323 |

Primary Examiner—Steven L. Stephan
Assistant Examiner—C. LaBalle
Attorney, Agent, or Firm—H. Fredrick Hamann; Harry B. Field; Steven E. Kahm

[57] ABSTRACT

An actuator has teeth for providing large forces to an object to be moved without experiencing slipping or sliding on the surfaces of the actuator or object. The actuator moves in smooth walking cyclic steps, first engaging the object by meshing the actuator's teeth with the teeth of the object, while moving at the same speed as the object, moving the object, retracting from the object while moving at the same speed as the object, and then retracing to its beginning position for starting a new cycle. The controller for the actuator obtains information about the relative position of the teeth for smoothly meshing the teeth and moving the object. The controller precisely moves the actuator for proper tooth meshing by using mechanical summing of actuator layers, each receiving electrical impulses of a precise number of waves of a known wave form. The controller continuously provides the desired wave form which can be switched between the actuator and an impedance which acts as if it were the actuator, including work readiness. The switching provides a triggered start of the waves to the actuator layers. The switch is thrown again when the wave count is reached which indicates the end of an actuator cycle. This system provides sudden actuator motion to start and stop the actuator and provides precision position and cycle control.

11 Claims, 3 Drawing Sheets

WALKING TOOTHED ACTUATOR

This is a continuation of Ser. No. 07/836,495, filed on Feb. 18, 1992, now abandoned.

BACKGROUND OF THE INVENTION

1. Field of the Invention

The present invention relates to walking piezoelectric actuators, and, in particular, to piezoelectric actuators having meshed teeth and a system for driving the actuator in a prescribed stride.

2. Description of Prior Art

A diverse class of piezoelectric actuators relies on frictional traction to forcefully position an object. Scuff-resistant materials generally have moderate non-sliding coefficients of friction. Moderate friction requires the application of a relatively large normal force to achieve a desired tangential, or tractive force. A large normal force requires a rigid container or housing to prevent deformation that otherwise relegates a portion of the actuator's stroke to container strain. Such rigid containers are heavier than the shells in which electromagnetic motors are commonly housed. Electromagnetic motor shells resist motor torque but need not resist large radial forces due to stator sector reactions.

Applicant's Piezoelectric Actuator U.S. Pat. No. 4,928,030 issued May 22, 1990, discloses a stack of actuators which are controlled to perform smooth walking actuation on an object. The normal force is high in this design. The patent discloses a stack of linearly acting actuators acting as lifters, axiers and tangenters for motion in a three axis co-ordinate system.

Applicant's copending application Ser. No. 07/708,643 filed May 31, 1991, now abandoned, discloses a series of actuators which can be activated to turn about an axis rather than move linearly. These actuators may be included in a stack of linearly acting actuators to yield a combination of linear and curved motions in one actuator.

An efficient power amplifier for high-capacitance devices like piezoelectric actuators is disclosed in U.S. Pat. No. 4,628,275 issued Dec. 9, 1986 to Skipper et al. In Skipper a power amplifier behaves as a stable linear D.C. coupled operational amplifier which delivers a large reactive current with only slight losses. A current sensing feedback is utilized to produce a triangular wave form of current in a load string for causing charge to be alternately applied to and removed from the capacitor with any losses replenished from the D.C. power source.

Walking actuators are also activated by a variety of power amplifiers capable of producing non-sinusoidal wave forms appropriate to smooth walking, for example, vacuum tube and solid state class A and A/B power amplifiers, and switching amplifiers such as those taught by Skipper, et al. Class A amplifiers provide instant startup at full motional amplitude, but internally dissipate all of the available power during standby, or quiescent actuator intervals. Efficiencies of these amplifiers, even with negligible quiescent time, are substantially lower than those achieved by non-sinusoidal resonant electric drives.

In Applicant's copending application Ser. No. 07/488,548 filed Mar. 5, 1990 and continued as Ser. No. 07/743,069 filed Aug. 9, 1991, now allowed, electric drive means employing resonance and mechanical Fourier summing of stroke contributions of segmented piezoelectric actuators achieve high efficiency by precluding rubbing during tractive actuator action, or walking. The non-sinusoidal mechanical summed strokes for walking are easily tailored to almost any wave form desired by varying the frequency and amplitude of resonance of each actuator segment. A tracting actuator operates on a continuous traction surface. Advantageously, a continuous surface may be walked by strides of any length within the reach of the actuator, including zero stride.

SUMMARY OF INVENTION

In this application there is disclosed a subclass of piezoelectric actuators, which by dint of engaged teeth, achieves large actuating forces relative to equivalent actuators that rely solely on traction. The engaged teeth also reduce or eliminate the large normal force of contact associated with traction actuators. Reduced normal force allows the reduction of the thickness and weight of the housing needed for an equivalent toothed actuator. However, unlike traction actuators, toothed actuators are intolerant of any walking stride that is not an integer of the tooth spacing, or period. The toothed class of actuator requires period matching stride length beginning with the first stride of operation, and therefore requires an electrical drive means that provides full stride electrical amplitudes, while also providing an electrical efficiency appropriate to the relatively high electromechanical efficiency of the toothed piezoelectric actuator. Therefore an electric drive means is employed which uses a series of switches to activate layers of electrodeformable material in the actuators when the wave forms to the respective actuator segments are at a zero current crossing. The waves to each segment are selected to produce the desired movement of the actuator in precise movements so that the teeth in the actuator always mesh, a smooth walking force is applied to the actuator and mechanical summing results in a precise stroke cycle. Responsive, full-stride electric drive means employing switched standby resonance contribute to relatively high overall system efficiency.

OBJECTS OF THE INVENTION

The primary object of the present invention is forceful positioning of a toothed object by alternating walking of two or more sets of intermittently engaged toothed actuators.

Another object of the present invention is commencement of forceful positioning with integral tooth periods of motion.

A further object is application of substantially greater force than otherwise available from an equivalent apparatus that uses traction.

Yet another object is the reduction and alternatively the elimination of force normal to the general toothed plane.

Still another object is the reduction of size and weight of the apparatus by dint of the reduction and elimination of normal force of actuation.

Another object is the mechanical summing of actuator segments by electrically stimulating the segments individually to produce a precise smooth walking movement cycle wherein the teeth mesh smoothly during operation.

A further object is an electronic control system for resonant electrical signals to produce discrete non-sinusoidal transducer output by phase locking a series of signals to the actuator segments and switching the signals in unison during a zero current crossing and counting the waves to each actuator segment so as to complete the programmed actuator cycle signal simultaneously.

Other objects, advantages and novel features of the present invention will become apparent from the following detailed description of the invention when considered in conjunction with the accompanying drawings.

DETAILED DESCRIPTION

Figure 1:
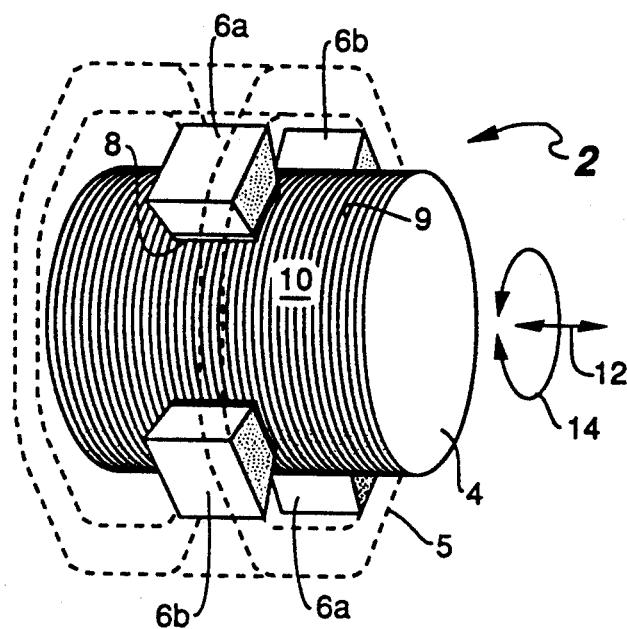
FIG. 1 is a perspective drawing of a toothed actuator for axial positioning of a toothed shaft.

Referring to FIG. 1, shown is a perspective drawing of a walking toothed actuator 2, comprising shaft 4, actuator pairs 6a and 6b, and housing 5 phantomed for clarity. Shaft 4 further comprises external surface 10 on which teeth 9 are formed. Each actuator 6a, 6b has a crown 8, one surface of which bears teeth 7 (FIG. 2) that match teeth 9 of shaft 4. The actuators 6a, 6b are affixed to internal surfaces of housing 5. The actuators 6a, 6b forcefully position shaft 4 in radial direction 14 by traction and more forcefully in axial direction 12 by tooth engagement. The tooth engagement shown provides a larger positioning force in axial direction 12 than tooth traction in rotary direction 14 using a given normal force.

Figure 2:
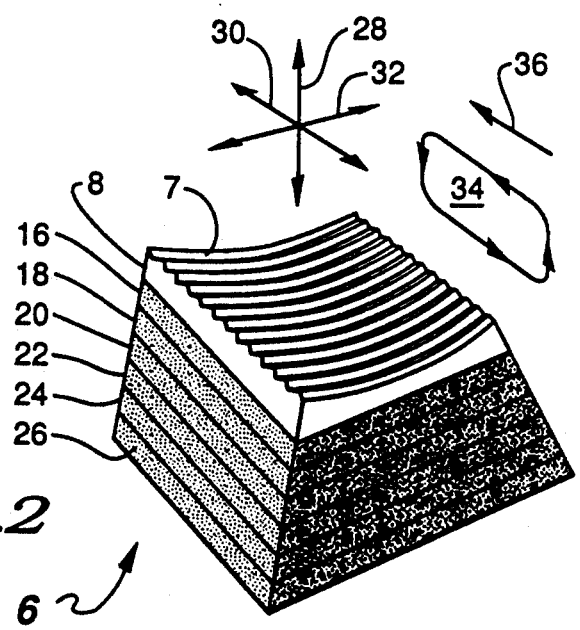
FIG. 2 is a perspective view of the layers used in an actuator and the teeth on the actuator as used in the apparatus of FIG. 1.

FIG. 2 is a perspective view of one actuator 6 of FIG. 1, comprising crown 8 and actuator body layers 16, 18, 20, 22, 24 and 26. Support means and electrical connections are omitted for clarity. Crown 8 bears teeth 7 on its surface which is proximate shaft 4 which has teeth 9 (see FIG. 1). In one embodiment electrical stimulation of layers 18, 22, and 26 moves crown 8 of actuator 6 relative to affixed actuator housing 5 (omitted) linearly in directions 28, 30, and 32 respectively.

Actuator body layers (or segments) are independently electrically addressable. Each body layer shown is composed of a plurality of layered segments of electrodeformable material, the controls for which are described in more detail infra. In one of many possible arrangements in which electromechanically reciprocal electrodeformable material is used, layer 16 is a force sensor that provides an electrical signal proportional to actuation force in direction 28. Layer 18 provides a combination of force and displacement in direction 28 related to the magnitude of an electrical signal applied to that layer. Layer 20 provides an electrical signal proportional to actuator force in direction 30. Layer 22 provides a combination of force and displacement in direction 30 related to the magnitude of an electrical signal applied to that layer. Layer 24 provides an electrical signal proportional to actuator force in direction 32. Layer 26 provides a combination of force and displacement in direction 32 related to the magnitude of an electrical signal applied to that layer.

Sensor layers 16, 20, and 24 provide signals to a controlling means. Force-displacement layers 18, 22, and 26, in response to electrical signals supplied by the controlling means, cause crown teeth 7 to forcefully position in a predetermined manner, for example, a cyclical combination of motions in directions 28 and 30 that causes crown 8 to trace path 34. The size and shape of path 34 is prescribed to cyclically engage and forcefully position shaft 4 in direction 36. Direction 36 may be parallel to direction 12 of FIG. 1. Actuator pairs 6a and 6b engage teeth sequentially, for movement of shaft 4.

For a more detailed explanation of actuator stacks and how they move shafts by smooth walking motion see Applicant's U.S. Pat. No. 4,928,030 entitled Piezoelectric Actuator issued May 22, 1990, which is hereby incorporated herein by reference.

In another embodiment of the invention linearly acting layers 18, 22, or 24, in actuators 6, may be replaced by twisting actuator layers for transmitting rotary crown motion to shaft 4. For a more detailed explanation of twisting actuators see Applicant's copending patent application Ser. No. 07/708,643 entitled Twisting Actuator filed May 5, 1991 which is hereby incorporated herein by reference.

Figure 3:
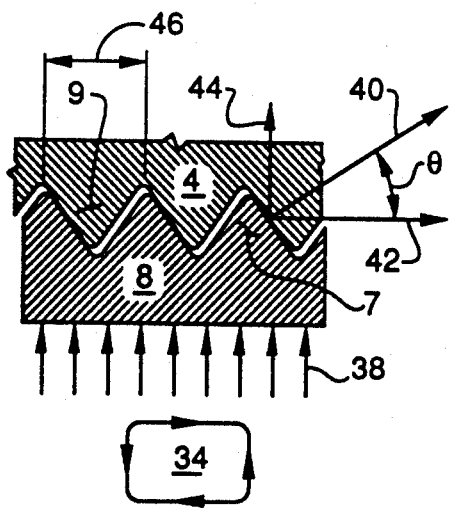
FIG. 3 is a cross section portion view of engaged teeth as used in the actuator.

FIG. 3 illustrates a portion cross section of tooth engagement, comprising crown 8 having teeth 7, and a portion of positioned object 4, having teeth 9. Teeth 7 and 9 have pitch, or period 46. Crown 8 provides a force vector 42 to object 4. The angle of contact $\Theta$ of teeth 7 and 9 requires a normal force 44 in order to provide tangential force 42. Most embodiments distribute the sum of tooth normal forces 38 uniformly over the area of crown 8. Force vector 40 is the resultant of the normal and tangential tooth forces. Force vectors 42 and 44 are related to force 40 by cos $\Theta$ and sin $\Theta$, respectively. Triangular or rounded teeth are preferred for embodiments in which the actuators 6 are electrically excited by relatively low frequency signals that round the corners of tooth positioning path 34. Tooth period 46 corresponds to the width of crown trace 34. The height of crown trace 34 is greater than or equal to the measure of tooth engagement. Non-rectangular teeth are preferred when significant normal force is desirable to maintain a vise-like grip on the positioned object.

Figure 4:
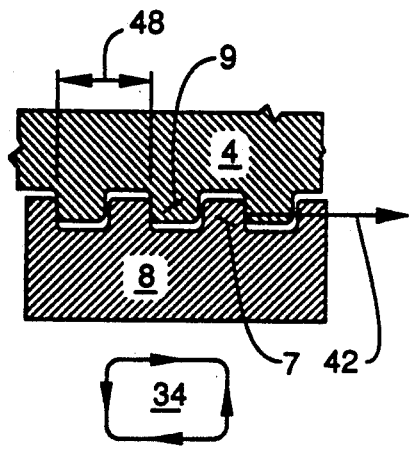
FIG. 4 is a cross section portion view of engaged teeth having an alternate design using angular teeth.

FIG. 4 is a rectangular variant of the tooth form of FIG. 3 having Θ equal to zero. Tooth period 48 corresponds to the width of crown trace 34. The height of crown trace 34 is greater than or equal to the measure of tooth engagement. Each tooth contacts a proximate tooth face in a plane perpendicular to the direction of tangential force 42 exerted on object 4 by crown 8. Having Θ equal to zero obviates the normal force. Although not evident from the figure, the corners of trace 34 will necessarily be "sharper" in the time domain than the corners of FIG. 3.

Regardless of tooth profile, crowns trace out a path during forceful positioning of an object that is composed of two or three non-sinusoidal motions. The wave forms (as seen infra) of the coordinated motions are prescribed such that teeth are engaged, loaded, forcefully positioned, unloaded, disengaged, and retraced to the next tooth without tooth rubbing. Unlike gear teeth that rub constantly and require lubrication for practical life, these "smooth walking" teeth operate unlubricated in a vacuum and in other hostile environments. Aside from welding (avoidable by design) due to excessive pressure, wear mechanisms in the smoothly walked toothed actuator are few and relatively benign.

Figure 5:
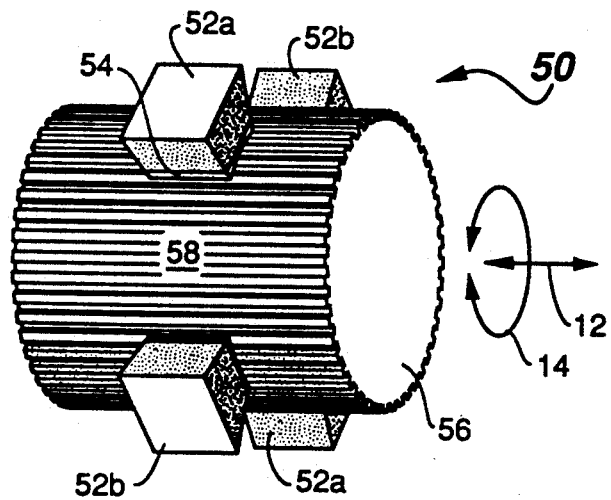
FIG. 5 is a perspective drawing of an embodiment of the present invention providing actuators for axial positioning in combination with relatively large rotary positioning force of a shaft.

FIG. 5 is a perspective view of an alternate embodiment of the present invention, comprising actuator pairs 52a, 52b and shaft 56. Each actuator 52 has a toothed crown 54 engaging the toothed surface 58 of shaft 56. The illustrated variant provides a larger positioning force to shaft 56 in rotary direction 14 than provided by the axial force accruing from traction of teeth in direction 12, both motions being available.

Figure 6:
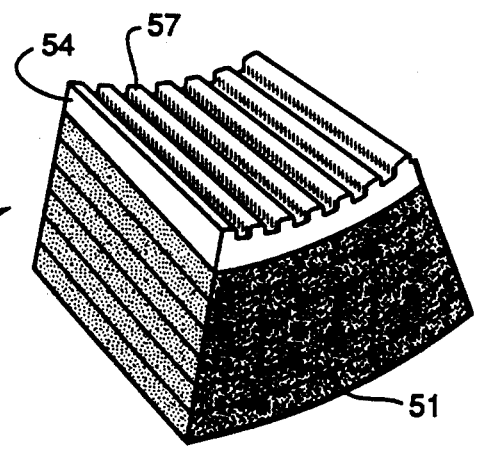
FIG. 6 is a perspective view of an actuator having layers and teeth for the apparatus of FIG. 5.

FIG. 6 is a perspective illustration of an actuator 52 of FIG. 5, comprising a layered actuator body and crown 54 having teeth 57 arranged paraxial to a cylinder. Actuator layers providing rotation of shaft 56 may be curved 51 to have the shape of segments of a cylinder so as to act annularly about the axis of shaft 56. Actuator layers that engage and disengage teeth act purely radially, thereby precluding the use of a rectangular tooth profile. Teeth for this embodiment have a trapezoidal cross section with sides disposed at an angle at least as great as the angular subtense of the crown width relative to the axis of the cylindrical shaft.

In another embodiment one layer of actuator 52 may be a swinger which will provide an arcuate movement of the crown 54. The use of swingers could eliminate the need for curved layers 51 in the actuator.

Figure 7:
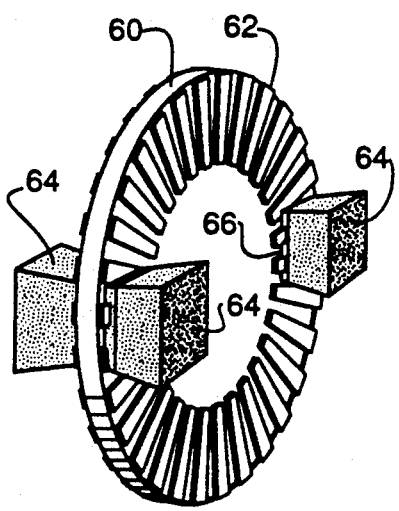
FIG. 7 is a perspective view of an alternate embodiment of the present invention providing forceful rotary positioning of a disk-like rotor.

FIG. 7 is a perspective view of an alternate embodiment of the present invention, comprising disk 60 and actuators 64, three of which are visible. Actuators are affixed to a housing (omitted for clarity) and connected to a source of electrical power (also omitted). Disk 60 further includes on opposite faces teeth 62 that mesh with teeth 68 of actuator crowns 66. Application of electrical signals to the actuators forcefully rotates disk 60 by dint of cyclically walking actuator crowns 66.

Figure 8:
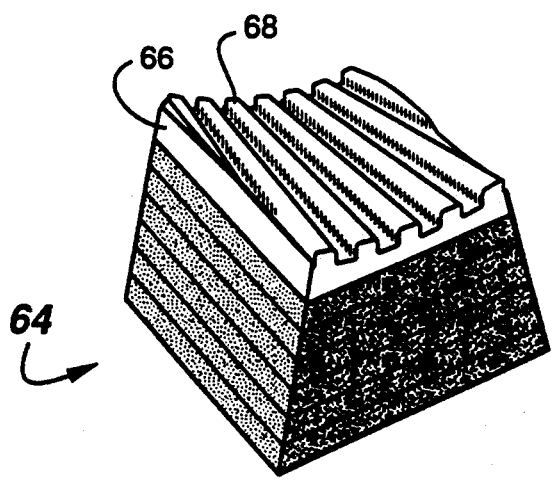
FIG. 8 is a perspective view of an actuator of the apparatus of FIG. 7.

FIG. 8 is a perspective view of actuator 64 of FIG. 7 comprising independently electrically addressable body layers and crown 66 having radial teeth 68. Body layers that actuate disk 60 in the rotary direction move crowns in a cylindrical arc segment path. These layers may be twisters or combinations of axiers and tangenters. Body layers in the actuators that cause tooth engagement, such as lifters, move in a direction parallel to the axis of rotation of disk 60. Another set of body layers (biaxiers, see infra) secularly corrects radial position errors due to any combination of differential thermal expansion and the misaligning effects of temperature gradients within the apparatus as a whole, thereby maintaining predetermined tooth alignment and desirably indeterminate tooth contact.

For a more detailed explanation of the layers that correct for misalignments, see Applicant's copending application Ser. No. 07/726,441 entitled Biaxial Transducer filed Jul. 5, 1991 which is hereby incorporated herein by reference.

The above described toothed actuators, in order to avoid damaging the teeth, requires crown strokes that are multiples of the tooth period. A partial-period stroke causes tooth gnashing, and also results in force contention between engaged tooth sets of one actuator and another. In order to provide an actuator drive system which can accurately control the position of the actuators a new method of actuator control is required.

Figure 9:
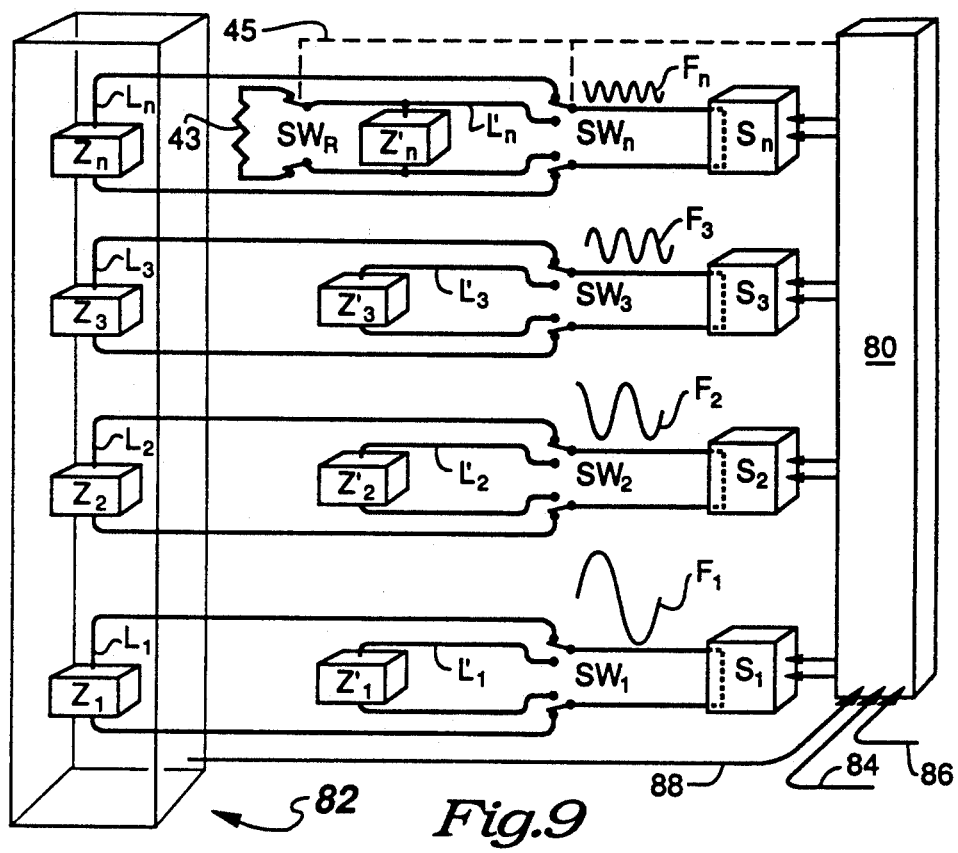
FIG. 9 is a schematic diagram of the controller circuit.

FIG. 9 is a schematic diagram of an embodiment of a controller for accurately driving the actuators. The system comprises a controller 80, a plurality of electrical stimulators S1 . . . Sn connected to controller 80, a corresponding plurality of switches SW1 . . . SWn, a corresponding plurality of impedances Z1 . . . Zn comprising individual layers of an actuator 82, and a corresponding plurality of auxiliary impedances Z'1 . . . Z'n. In a first position (opposite that shown in the figure) of switches SWn electrical loops L'1 . . . L'n connect the corresponding stimulators with auxiliary impedances Z'1 . . . Z'n. In a second switch position (illustrated), electrical loops L1 . . . Ln connect the corresponding stimulators with actuator layer impedances Z1 . . . Zn. Impedances Z normally comprise electrical reactances, such as inductors and/or capacitors. In FIG. 9, the base of the actuator 82 is fixed so that the motion of the crown corresponds to the mechanical output wave form.

External electrical power is supplied to controller 80 on a line 84. Instructions, typically comprising an analog of the desired actuator output, are provided to controller 80 on a line 86. Using the supplied instructions, controller 80 computes and controls the distribution of electrical power to the stimulators to produce the desired resonances in connected loops. As an option, the system may include feedback line 88 connecting the sensors in actuator 82 to controller 80. A feedback signal on line 88 may, for example, represent a combination of actuator output states and the relative positions of actuator segments.

Position sensors can be used to provide the controller with data related to the position of the actuator crown and the shaft. The position sensors may also keep the controller informed of the relative tooth positions.

The amplitude of the electrical signal supplied to each actuator segment impedance is a periodic function of time. Each stimulator drives its loop with a resonant electrical signal. Resonance is maintained in loops L'1 . . . L'n when the transducer is idle. Resonance is transferred to the actuator loops L1 . . . Ln when switch positions are changed to activate the actuator. The frequency, amplitude, phase, and polarity of the desired response of each loop, represented by F1 . . . Fn, respectively are determined by controller 80 from instructions received on line 86.

Controller 80 may use the Fourier theorem to select the frequency, amplitude, phase, and polarity of each segment response F. The resonant electrical signal provided on each loop produces the appropriate response F of that loop's stimulator segment. The vector sum of the individual segment motions is the overall actuator output. This process is analogous to the synthesis of a non-sinusoidal electrical wave form by electrically adding a plurality of sinusoidal electrical signals. However, the present invention is distinguished from such prior systems by the absence of electrical summing and by the operability without mechanical resonance. The system of the present invention uses electrical resonance and mechanical summing to achieve the desired transducer output.

Actuator 82 of FIG. 9 may comprise segmented piezoelectric actuators as described above. In this embodiment, the impedances Z comprise dimorph impedances (individual dimorphs or groups of dimorphs connected in electrical parallel and mechanical series), while impedances Z' comprise auxiliary impedances of matching value that react electrically as capacitances.

Many electrodeformable actuators having electrically reactive segments appear to the drive means as a purely capacitive or purely inductive load, depending on the makeup of the segments. This condition generally prevails when no mechanical work is done by the actuator during normal activation. When the actuator produces mechanical work, the electrical load of each actuator segment also includes a dissipative component. Familiar to those versed in the electrical arts the dissipative component of an actuator segment is representable by an equivalent circuit (omitted) having an idealized purely reactive component in combination with purely resistive components.

A variant of the control system of FIG. 9 further includes in one or each of the auxiliary reactance loops $L'1 \ldots L'n$ a resistor 43 and a switch $SW_R$. When actuator 82 is presently to be activated, and mechanical work is expected of the actuator, switch $Sw_R$ is changed (as illustrated) to include in the loop the resistance 43 corresponding to the electrical equivalent of the virtual work done by auxiliary impedances $Z'1 \ldots Z'n$, thereby establishing an anticipatory work-producing resonant state of readiness. Activation of the working actuator proceeds when switches $SW1 \ldots SWn$ are changed as illustrated. If the actuator is to commence operation without mechanical work, switches $Sw_R$ are left open (opposite state illustrated).

Switches $SW_R$ and $Sw1 \ldots Swn$ are responsive to state change signals 45 (dashed lines) of controller 80. The value of resistor 43 is predetermined to be representative of the component of actuator current that is converted from electrical power to mechanical work. A variant embodiment of the control system uses variable resistances 43, each resistance value being adjusted by control signals 45 of controller 80, appropriate for the work-producing current component of the corresponding actuator segment. Sensor signals of actuator body segments, previously described, inform controller 80 of the magnitude and phase of the work-producing current components by way of feedback lines 88, allowing controller 80 to maintain the system in a state of complimentary resonance, regardless of the states of switches $Sw1 \ldots SWn$. The values of resistances 43 may also be controlled to temporarily compensate for apparent transient work, such as inertial reactions of a motor operated in a stepwise manner.

Motors operated as generators responsive to intermittent mechanical input, such as wave motion, periodic geothermal sources and the like, maintain a state of multiresonant readiness by adjusting the values of resistors 43 to be representative of predetermined magnitudes of electrical power extracted when actuator 82 commences generating.

Actuators providing fixed strokes, such as walking toothed piezoelectric actuators, benefit from the resonant reactance substitution that commences full-stride actuator operation when the loop switches change state. Reversion to the idle actuator state occurs with the same suddenness, control, and efficiency.

Figure 10:
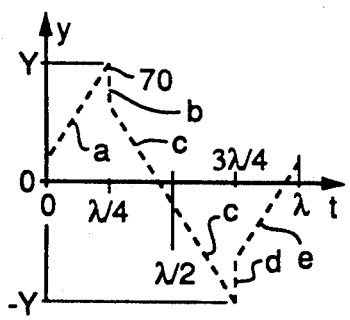
FIG. 10 is a plot of an ideal mechanical wave form for the tangential action of a two-axis, constant velocity, smooth walking piezoelectric toothed actuator.

Referring to FIG. 10, dashed line wave form 70 is an ideal mechanical wave form of the tangential component of a two-axis piezoelectric actuator during smooth walking of an object, for example, with constant velocity, wave form 70 is a plot of tangential position, y, of the actuator crown as a function of time, t. Tangential force is exerted during portion a of wave form 70, and removed during portion b. Retrace is accomplished during portion c, tangential force is reapplied during portion d, and the new tangential forcing cycle takes place during portion e. In this example, tangential wave form 70 is periodic with period lambda. With the use of bipolar transducer segments, such as dimorphs, wave form 70 is symmetric about a quiescent mechanical position 0, with extremes of tangential motion indicated as Y and $-Y$.

Figure 11:
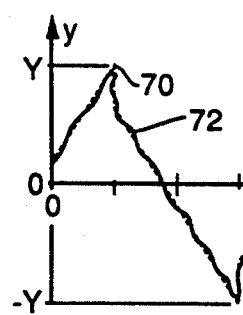
FIG. 11 is a plot of the mechanical sum of six actuator segments approximating the ideal wave form of FIG. 10.

Referring to FIG. 11, wave form 72 illustrates actuator tangential motion of an actuator having six segments (dimorph groups), the individual tangential motions of which are summed as vectors. Actual wave form 72 is shown superimposed on ideal wave form 70. In theory, ideal wave form 70 can be achieved by summing the motions of an infinite number of actuator segments driven with separate loops. In practice, however, the sum of a relatively small number of segment motions adequately emulates the ideal wave form, as shown in FIG. 11.

Figure 12:
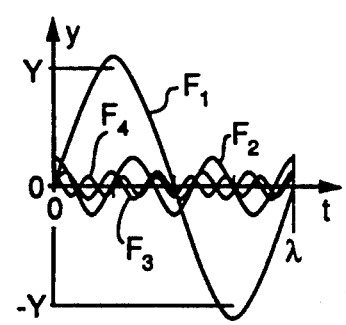
FIG. 12 is a plot of the first four individual wave forms of the six actuator segments that are summed to produce the plot of FIG. 11.

FIG. 12 illustrates the plots of individual output wave forms $F1 \ldots F4$ of the first four segments of an actuator. For the case of linear actuator response, these curves correspond in phase and frequency to the electrical stimulations of loops $L1 \ldots L4$, respectively. In this example, half of the loops resonate with sine waves and the other half resonate with cosine waves. For piezoelectric walking, the force of tangential output is varied by adjusting the cosine amplitudes, while the speed of Actuator force and speed may be varied independently and simultaneously. In the general case, all the actuator segments (e.g., dimorphs) are driven to the same peak potential that produces the most efficient but safe operation. Amplitude of the output motion of each segment can be changed by adjusting the size of the electrical impedance of each loop. For piezoelectric actuators, the capacitance of each segment can be modified by connecting different numbers of similar dimorphs in electrical parallel. This can be accomplished by the controller, for example, by using electrical switches (not shown) connected in the loops between the state switches and the transducers. In the example illustrated in FIG. 12, the amplitude of F1 is greater than that of F2 because impedance Z1 is greater than impedance Z2.

Figure 13:
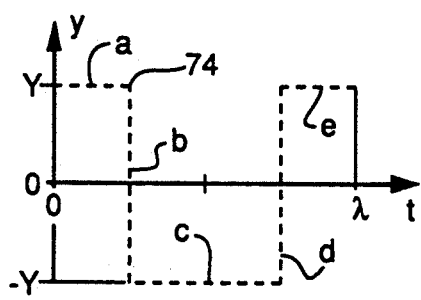
FIG. 13 is a plot of an ideal mechanical wave form for the perpendicular action of a two-axis, smooth walking piezoelectric toothed actuator.

Referring to FIG. 13, wave form 74 is a dashed line plot of the ideal transducer output y as a function of time t for the perpendicular actuating portion (lifter) of a two-axis piezoelectric walking actuator. The actuator applies normal force to a positioned object during portion a of wave form 74, removes normal force and lifts the crown clear of the object during portion b, awaits retrace by the tangenter during portion c, and reapplies the crown to the object during portion e for the next walking cycle. The walking period lambda is the same for FIGS. 10-14 when tangenter and lifter motions are coordinated.

Figure 14:
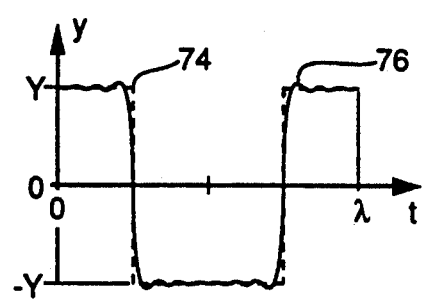
FIG. 14 is a plot of the mechanical sum of six actuator segments approximating the ideal wave form of FIG. 13.

FIG. 14 shows the truncated Fourier series wave form 76, comprising the vector sum of six individual lifter segments, overlaid on the ideal wave form 74, illustrating the close approximation achieved with relatively few independently stimulated actuator segments.

Most electrical transducers temporarily store electric and elastic energy. In an ideal resonant system, the stimulators supply only the electrical power that is to be converted to mechanical work, and the energy stored in loops as reactive power and elastic strain is recirculated without loss. Electrical loops for segmented transducers can be made with low resistance by excluding semiconductor components from the loops. Semiconductors can be relegated to the controller sides of the stimulators, for example.

Many applications of the present invention to fixed-stride actuators allow substantial departure from the ideal smooth walking wave form. For example, a toothed piezoelectric replacement for an hydraulic actuator allows considerably rougher running than a positioner for an optical element. For coarse running applications, a less accurate approximation of the ideal Fourier sum can be tolerated. This allows connection of dimorphs into fewer series loops, which simplifies control. The relatively greater capacitance of larger dimorph groups may allow operation of each loop at a lower frequency, with larger charge transfer swings (i.e., reactive currents) that provide longer segment strokes. When each series loop is constructed with the least practical electrical resistance, very large reactive currents can be handled. When larger reactive currents flow with relatively reduced resistive dissipation, efficiency is improved. Large reactive currents also increase the speed of actuation, allowing greater power extraction from the actuators.

Standby switches that affect the resonant reactance substitution in the most orderly manner change state in unison. However, transducer segments operating with cosine terms require the switches to handle full reactive current. Optionally, the controller may change the state of each loop switch at the respective instant of zero reactive current. Therefore all of the loops except the fundamental (lowest frequency) loop will have switching delayed in time, causing less than ideal resonant reactance substitution. Considering the allowance for rough running in many applications, in combination with the fact that all higher-order loops have periods that are but a fraction of the fundamental period (relatively short time delays), the benefits of zero-crossing switching outweigh the disadvantage of a somewhat disorderly state change in such applications. The primary benefit of zero-crossing switching is the reduced size, bulk, cost, resistive dissipation, and speed of the switches. A compact embodiment of the actuator in combination with the responsive drive means of the present invention incorporates many of the drive components integral with or closely adjunct to the actuator body. Piezoelectric actuator bodies generally operate with negligible temperature rise. The use of integral zero-crossing switches precludes significant additions to the actuator body heat load.

As an example of an alternative embodiment of the present invention, piezoelectric actuator capacitances can be replaced by inductances, each actuator inductance being a separate solenoid. In this embodiment, the solenoids are colinear around a magnetostrictive rod. The mechanical stroke at one end of the magnetostrictive rod is a non-sinusoidal wave form that is the truncated Fourier sum of the strokes induced by each solenoid (neglecting coupling). A combination of auxiliary capacitors and inductors affect electrical energy storage in the resonance maintenance (standby) portion of the controlling circuit, allowing responsive, stepwise operation.

Actuators having a combination of capacitive and inductive reactances are switched with loops containing equivalent capacitive and inductive reactances in a manner allowing mutual sharing of temporary electrical energy storage, thereby reducing the number of electrical components of the system. A similar arrangement connects capacitive transducers with equivalent inductive transducers that mutually share the electrical energy storage function. Shared storage reduces system size and complexity.

In another embodiment, the dimorphs and solenoids described above can be replaced by actuators comprising electrically heated segments of a thermal expansion material. It can be seen from the foregoing examples that although the types of segmented actuators may vary considerably, the principles of the responsive electrical drive system of the present invention remain the same.

A wide variety of stroke wave forms can be generated by the present invention by selection of appropriate loop frequencies and Fourier coefficient amplitudes. Uses for the various embodiments of the invention include smooth walking actuators, electromagnetic motors, stepping motors, and thermal expansion actuators. Stepable, non-sinusoidal periodic output is an advantage in many applications because predetermined portions of each actuator stroke may require different magnitudes of force, velocity, and acceleration. In addition, application of the present invention to the toothed actuator allows any combination of single step activation, multi-step activation, and continuous constant-velocity running. Discrete strides of toothed actuators, in combination with electronic means of stride counting, provide the controller with history and present position of the positioned object with an uncertainty of $\pm \frac{1}{2}$ stride. Piezoelectric toothed actuators have relatively small strides and correspondingly small tooth periods, providing inherent open loop position determination with accuracy more than adequate for a diverse class of positioning application.

A consequence of full forcing capability in a single step, actuators enjoying the benefits of the present invention offer advantageous capacity to position relatively large inertial loads. Alternatively, the same actuator and responsive drive system handles smaller inertial loads with relatively large accelerations and decelerations, allowing fast and accurate positioning. For example, a piezoelectric walking toothed actuator having tooth pitch equal to the distance between magnetic disk drive data tracks, can position the read-write head with accelerations substantially greater than tolerable by known head support structures.

Changing the switch states at zero current of each transducer segment leaves each segment in a zero electrical condition and essentially at a mechanical null position. At no time are the transducer segments excited by direct current or step changes in DC level. Whether quiescent or running resonantly, actuator segments are given no opportunity to drift. Freedom from drift is particularly important in piezoelectric actuators made of material with some domains that align slowly (hysteresis).

The piezoelectric actuators described herein may be replaced by any form of electrodeformable actuator having a multiplicity of layers or segments.

Although the present invention has been described with respect to specific embodiments thereof, various changes and modifications may be suggested to one skilled in the art. Therefore, it is intended that the present invention encompass such changes and modifications as fall within the scope of the appended claims.

I claim:

1. An actuator comprising:
    a plurality of electrodeformable segments mechanically coupled to form a transducer, each of the electrode formable segments having,
    an electrical impedance,
    a second electrical impedance,
    a means for resonantly stimulating the impedances to produce a predetermined nonsinusoidal transducer output,
    an electrical circuit having a switch, for alternately connecting the electrodeformable segment or the second electrical impedance in electrical series with the means for resonantly stimulating the segment.

2. An actuator as in claim 1 wherein an electrical resistance and a second switch are added to the circuit containing the second electrical impedances, the electrical resistance being added to the circuit in parallel with the second electrical impedance wherein the second switch selectively connects the resistance to the circuit.

3. An actuator as in claim 1 wherein the plurality of electrodeformable elements form a stack having a crown with teeth, for engaging a movable object having a surface with teeth,
    a means of controlling the actuator wherein the actuator crown cyclically, engages the object by meshing teeth, moves the object, disengages from the object and retraces to begin another cycle.

4. An actuator as in claim 3 wherein,
    a plurality of actuators alternately engage and move the object having at least two actuators always in the engaging portion of a cycle so that the object is firmly held at all times.

5. An actuator as in claim 4 wherein,
    the actuator teeth are controlled to move at the same speed as the object teeth so as to mesh therewith without frictional rubbing as the teeth engage and disengage during a cycle.

6. An actuator as in claim 3 wherein,
    the mans for the controlling the actuators is a controller and the controller has a means to know the position of the actuators and the object.

7. An actuator as in claim 6 wherein,
    the means for resonantly stimulating the impedance is a stimulator for generating a wave form.

8. An actuator as in claim 7 wherein,
    the mechanical sum of the wave forms acting on the electrodeformable segments directs the crown of the actuator to move in a cycle.

9. An actuator as in claim 8 wherein,
    each segment in the actuator has a circuit linking ti to the stimulator and controller in which there is a switch for diverting the wave form from the stimulator to the secondary impedance, wherein the wave form from the stimulator is sent to the actuator during the actuator cycle and diverted to the auxiliary impedance when the actuator is not activated.

10. An actuator as in claim 9 wherein,
    the controller sets the switches to each actuator so that they are triggered to the on position simultaneously and remain in the on position until the wave count in the controller for each stimulator is reached, indicating the end of the actuator cycle.

11. An actuator as in claim 9 wherein,
    the auxiliary impedance has a resistor for simulating the mechanical work done by the actuator, and a switch to selectively add the resistor to the auxiliary impedance circuit.

* * * * *